US012557309B2

(12) United States Patent
Verma et al.

(10) Patent No.: US 12,557,309 B2
(45) Date of Patent: Feb. 17, 2026

(54) SEMICONDUCTOR PACKAGE STRUCTURE

(71) Applicant: UNITED MICROELECTRONICS CORP., Hsin-Chu (TW)

(72) Inventors: Purakh Raj Verma, Singapore (SG); Ching-Yang Wen, Singapore (SG); Xingxing Chen, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 570 days.

(21) Appl. No.: 17/989,633

(22) Filed: Nov. 17, 2022

(65) Prior Publication Data

US 2024/0136312 A1    Apr. 25, 2024
US 2024/0234350 A9    Jul. 11, 2024

(30) Foreign Application Priority Data

Oct. 21, 2022 (CN) .......................... 202211293607.4

(51) Int. Cl.
*H01L 23/495* (2006.01)
*H01L 23/00* (2006.01)
(Continued)

(52) U.S. Cl.
CPC .............. *H01L 24/08* (2013.01); *H01L 24/16* (2013.01); *H01L 25/16* (2013.01); *H10D 1/716* (2025.01);
(Continued)

(58) Field of Classification Search
CPC ......... H01L 24/08; H01L 24/16; H01L 25/16; H01L 2224/08145; H01L 2224/16227; H01L 24/05; H01L 25/0657; H01L 25/18; H01L 23/49816; H01L 2224/0401; H01L 24/13; H01L 2224/80895; H01L 2924/1436; H01L 23/147; H01L 2225/1058; H01L 24/14; H01L 2924/1205; H01L 24/17; H01L 24/06; H01L 21/76251; H01L 2224/32145; H01L 2924/1431; H01L 2224/81894; H01L 2225/1035; H01L 2224/17104; H01L 2224/16145; H01L 2224/08235; H10D 1/716; H10D 86/201; H10D 1/047; H10D 84/212; H10D 88/00
See application file for complete search history.

(56) References Cited

U.S. PATENT DOCUMENTS 10,090,342 B1 * 10/2018 Gambino ............... H10D 84/40
10,290,571 B2    5/2019 Yu et al.
(Continued)

FOREIGN PATENT DOCUMENTS

TW    202133391 A * 9/2021 ............. H10D 1/711

*Primary Examiner* — Niki H Nguyen
(74) *Attorney, Agent, or Firm* — Winston Hsu (57) ABSTRACT

A semiconductor device includes a first wafer having a deep trench capacitor and a second wafer bonded to the first wafer, in which the second wafer includes a first active device on a first silicon-on-insulator (SOI) substrate and a first metal interconnection connected to the first active device and the deep trench capacitor. The first wafer further includes the deep trench capacitor disposed in a substrate, a first inter-layer dielectric (ILD) layer on the deep trench capacitor, a first inter-metal dielectric (IMD) layer on the first ILD layer, and a second metal interconnection in the first ILD layer and the first IMD layer.

12 Claims, 9 Drawing Sheets

(51) Int. Cl.
*H01L 25/16* (2023.01)
*H10D 1/68* (2025.01)
*H10D 86/00* (2025.01)

(52) U.S. Cl.
CPC . *H10D 86/201* (2025.01); *H01L 2224/08145* (2013.01); *H01L 2224/16227* (2013.01)

(56) References Cited

U.S. PATENT DOCUMENTS

| | | |
|---|---|---|
| 11,355,431 B2 | 6/2022 | Lai et al. |
| 2010/0200949 A1* | 8/2010 | Booth, Jr. .............. H10D 1/665 257/532 |
| 2011/0233757 A1* | 9/2011 | O'Neill ............... H01L 25/0657 438/107 |
| 2012/0181661 A1 | 7/2012 | Booth, Jr. |
| 2016/0064331 A1* | 3/2016 | Leobandung ....... H01L 23/5226 257/751 |
| 2019/0393153 A1* | 12/2019 | Wang ................ H01L 21/76802 |
| 2020/0328180 A1 | 10/2020 | Cheng |
| 2020/0328190 A1 | 10/2020 | Liu |
| 2021/0407942 A1 | 12/2021 | Yu |
| 2022/0302021 A1 | 9/2022 | Chen |

* cited by examiner

SEMICONDUCTOR PACKAGE STRUCTURE

BACKGROUND OF THE INVENTION

1. Field of the Invention

The invention relates to a semiconductor device, and more particularly to a semiconductor package structure.

2. Description of the Prior Art

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

3DICs provide improved integration density and other advantages, such as faster speeds and higher bandwidth, because of the decreased length of interconnects between the stacked chips. However, there are quite a few challenges to be handled for the technology of 3DICs.

SUMMARY OF THE INVENTION

According to an embodiment of the present invention, a semiconductor device includes a first wafer having a deep trench capacitor and a second wafer bonded to the first wafer, in which the second wafer includes a first active device on a first silicon-on-insulator (SOI) substrate and a first metal interconnection connected to the first active device and the deep trench capacitor. The first wafer further includes the deep trench capacitor disposed in a substrate, a first inter-layer dielectric (ILD) layer on the deep trench capacitor, a first inter-metal dielectric (IMD) layer on the first ILD layer, and a second metal interconnection in the first ILD layer and the first IMD layer.

According to another aspect of the present invention, a semiconductor device includes a first wafer on a packaging substrate as the first wafer includes a deep trench capacitor, a second wafer on the packaging substrate and adjacent to the first wafer, and a third wafer on the second wafer.

These and other objectives of the present invention will no doubt become obvious to those of ordinary skill in the art after reading the following detailed description of the preferred embodiment that is illustrated in the various figures and drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

Figure 1:
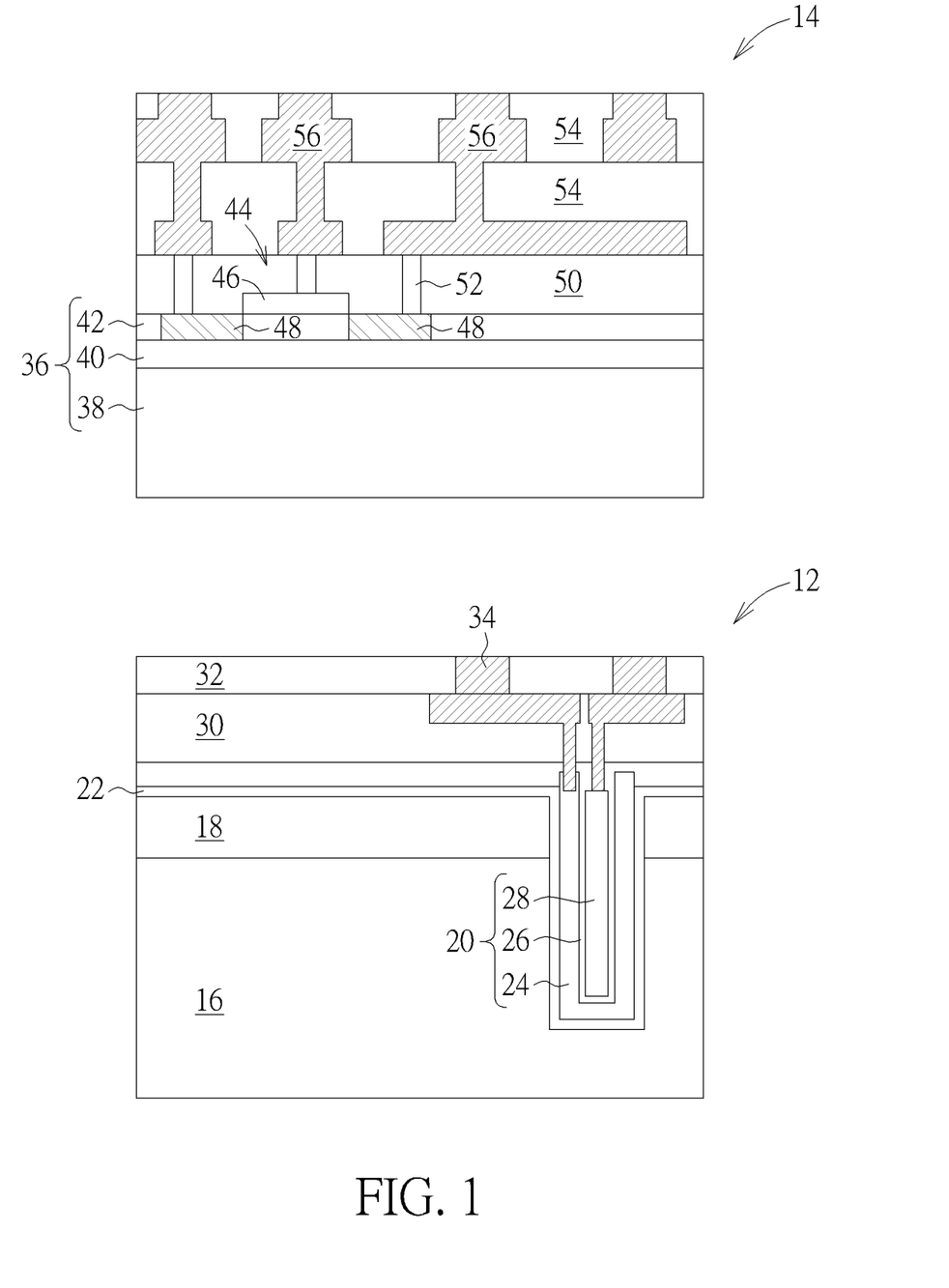
FIGS. 1-3 illustrate a method for fabricating a semiconductor package structure according to an embodiment of the present invention.
Figure 2:
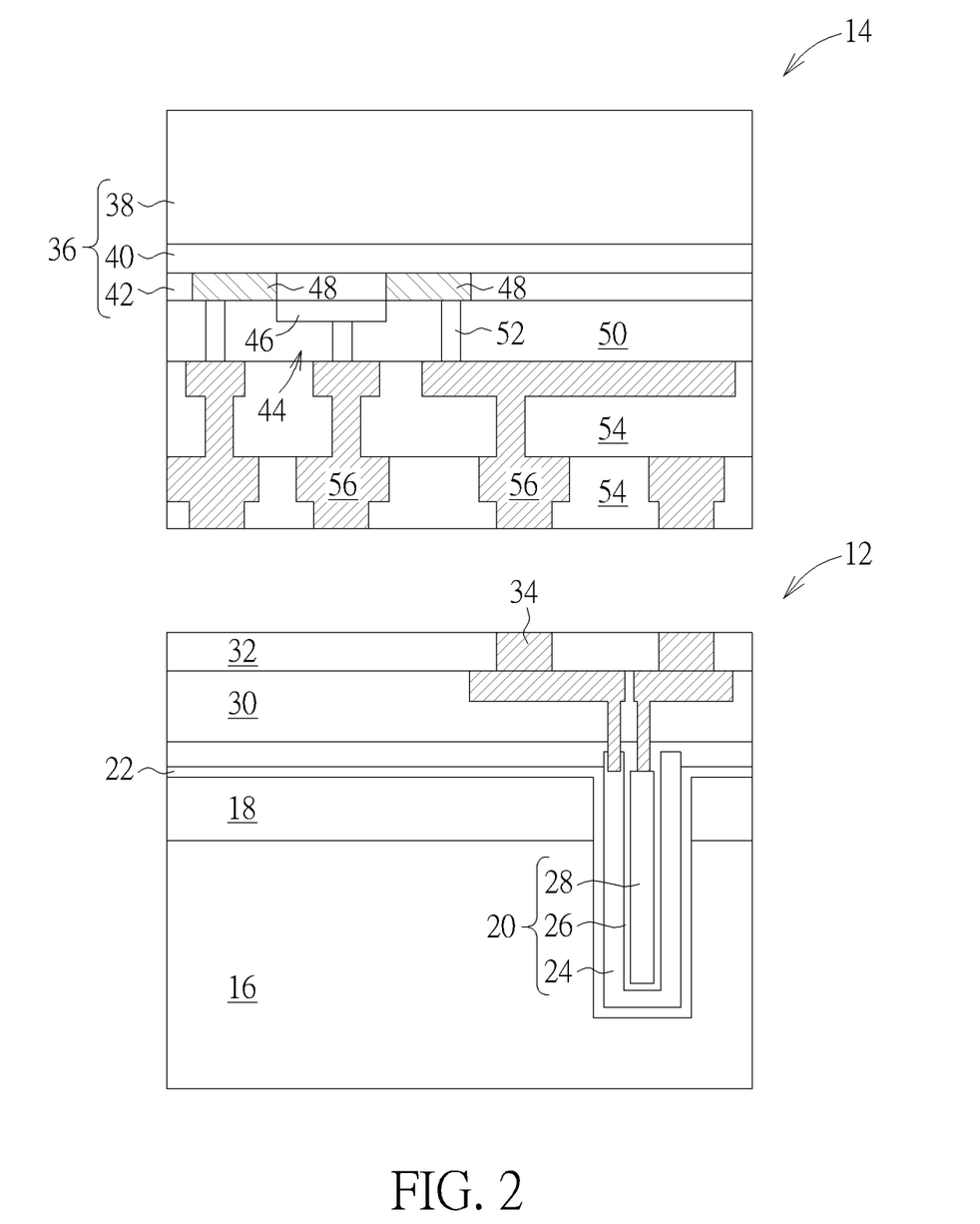
Figure 3:
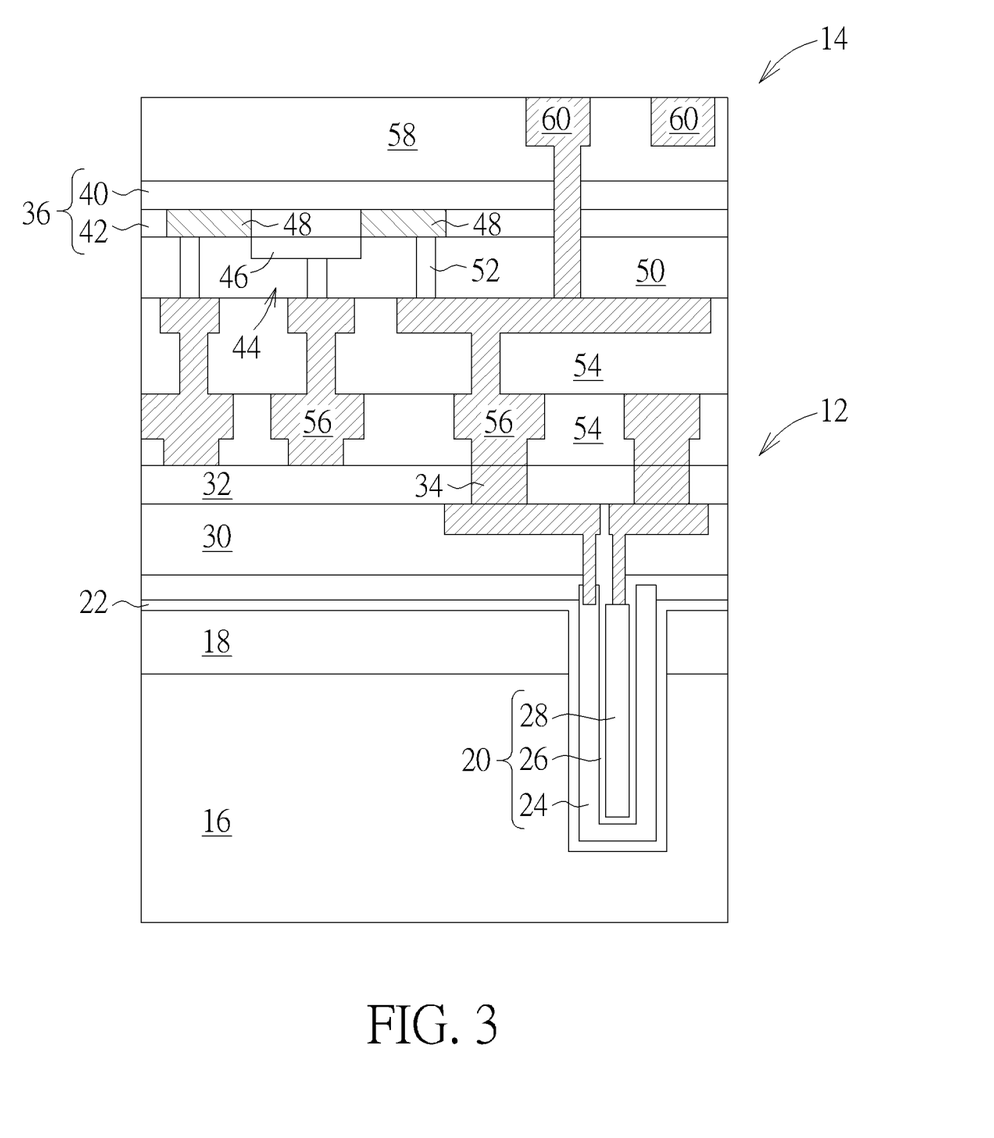

Referring to FIGS. 1-3, FIGS. 1-3 illustrate a method for fabricating a semiconductor package structure according to an embodiment of the present invention. As shown in FIG. 1, a wafer 12 and a wafer 14 both made of semiconductor material is provided, in which the wafer 12 is used for fabricating ultra high density (UHD) capacitors while the wafer 14 is used for fabricating switch devices or low noise amplifiers (LNA).

In this embodiment, the wafer 12 preferably includes a high resistance substrate 16, a dielectric layer 18 made of silicon oxide could be disposed on the substrate 16, and a deep trench capacitor 20 could be formed in the substrate 16. In this embodiment, the formation of the deep trench capacitor 20 could be accomplished by first removing part of the dielectric layer 18 and part of the substrate 16 to form an opening (not shown), forming a liner 22 made of silicon oxide on the surface of the dielectric layer 18 and into the opening, and then forming a deep trench capacitor 20 on the liner 22. Preferably, the deep trench capacitor 20 includes a bottom electrode 24, a capacitor dielectric layer 26, and a top electrode 28, in which the bottom electrode 24 and the top electrode 28 could be made of same or different material while both electrodes 24, 28 could be selected from the group consisting of W, Ti, TiN, Ta, TaN, and Al. The capacitor dielectric layer 26 on the other hand is made of low leakage dielectric material including but not limited to for example oxide-nitride-oxide (ONO), silicon nitride, silicon oxide, silicon oxynitride, (SiON), or combination thereof.

Next, an interlayer dielectric (ILD) layer 30 and an inter-metal dielectric (IMD) layer 32 are formed on the substrate 12 to cover the deep trench capacitor 20 and a contact plug formation and/or metal interconnective process could be conducted to form metal interconnections 34 in the ILD layer 30 and IMD layer 32 for connecting the deep trench capacitor 20. In this embodiment, the ILD layer 30 and IMD layer 32 could include tetraethyl orthosilicate (TEOS) and the metal interconnections 34 could include Al, Cr, Cu, Ta, Mo, W, or combination thereof and most preferably Cu, but not limited thereto.

Moreover, the wafer 14 in this embodiment preferably includes a substrate 36 made of a silicon-on-insulator (SOI) substrate, which preferably includes a first semiconductor layer 38, an insulating layer 40 on the first semiconductor layer 38, and a second semiconductor layer 42 on the insulating layer 40. Preferably, the first semiconductor layer 38 and the second semiconductor layer 42 could be made of same material or different material and could both be made of material including but not limited to for example silicon, germanium, or silicon germanium (SiGe). The insulating layer 40 disposed between the first semiconductor layer 38 and second semiconductor layer 42 preferably includes $SiO_2$, but not limited thereto. It should be noted that even though a SOI substrate is chosen as the substrate for the semiconductor device of this embodiment, the substrate of the wafer 14 could also be made of semiconductor substrate material including but not limited to for example silicon substrate, epitaxial silicon substrate, or silicon carbide substrate, which are all within the scope of the present invention.

Next, at least an active device 44 could be disposed on the substrate 36, in which the active device 44 could include metal-oxide semiconductor (MOS) transistor, oxide semiconductor field effect transistor (OS FET), fin field effect transistor (FinFET), or other active devices. If a MOS transistor were to be fabricated, the MOS transistor could include elements such as a gate structure 46 on the substrate 36, a spacer (not shown) adjacent to the sidewalls of the gate structure 46, and a source/drain region 48 in the substrate 36 adjacent to two sides of the spacer.

More specifically, the gate structure 46 could be a polysilicon gate made of polysilicon or a metal gate. If a metal gate were to be fabricated, it would further include elements such as a high-k dielectric layer, a work function metal layer, and a low resistance metal layer. Preferably, the high-k dielectric layer is selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer is formed for tuning the work function of the later formed metal gates to be adaptable in an NMOS or a PMOS. For an NMOS transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer, in which the material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

Next, an ILD layer 50 could be formed to cover the MOS transistor or other active devices, and a contact plug formation and/or metal interconnective process could be conducted to form a plurality of contact plugs 52 connecting the source/drain region 48 and gate structure 46, an IMD layer 54 disposed on the ILD layer 50, and metal interconnections 56 in the IMD layer 54 for connecting the contact plugs 52. In this embodiment, the ILD layer 50 and IMB layer 54 could include silicon oxide such as tetraethyl orthosilicate (TEOS) and the contact plugs 52 and metal interconnections 54 could include Al, Cr, Cu, Ta, Mo, W, or combination thereof, but not limited thereto.

Next, as shown in FIG. 2, a bonding process is conducted by using a direct bond interconnect (DBI) approach to bond the wafer 12 and the wafer 14. Preferably, the bonding process could be accomplished by first reversing the wafer 14 so that the front side of the wafer 14 or the exposed surface of the metal interconnections 56 and IMD layer 54 is facing toward the front side or exposed surface of the metal interconnections 34 and IMB layer 32 of the wafer 12 and then performing a thermal treatment process to directly bond the metal interconnections 34, 56 of the two wafers 12, 14 so that the metal interconnections 56 and IMB layer 54 of the wafer 14 directly contact the metal interconnections 34 and IMB layer 32 of the wafer 12.

Next, as shown in FIG. 3, the first semiconductor layer 38 from the substrate 36 of the wafer 14 is removed to expose the surface of the insulating layer 40, and then a metal interconnective process shown in FIG. 1 is conducted to form one or more dielectric layer 58 on the insulating layer 40 and metal interconnections 60 in the dielectric layer 58, the substrate 36, and the ILD layer 50 for connecting to the metal interconnections 56 that have been formed in the IMD layer 54 since FIG. 1. This completes the fabrication of a semiconductor package structure according to an embodiment of the present invention.

Figure 4:
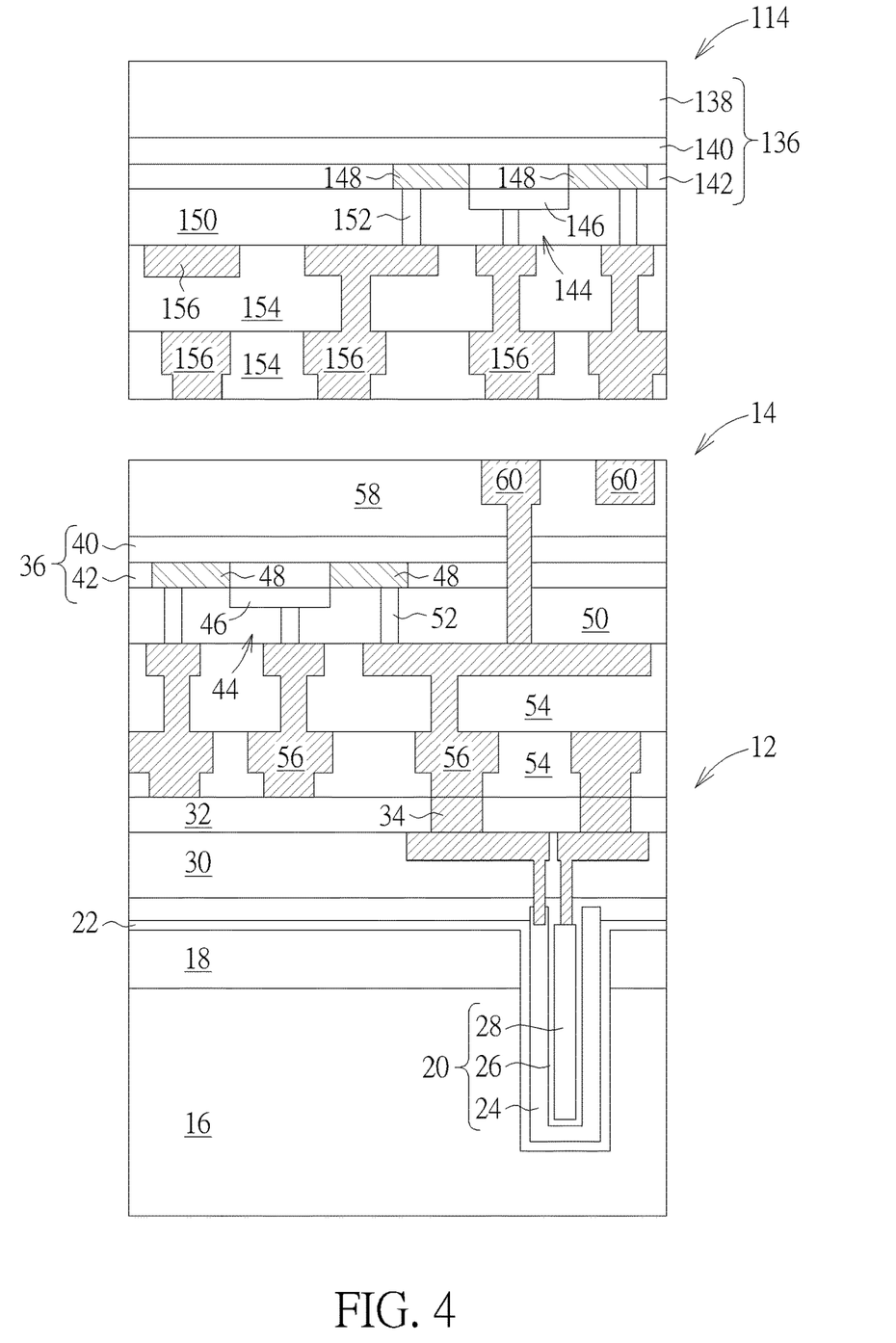
FIGS. 4-6 illustrate a method for fabricating a semiconductor package structure according to an embodiment of the present invention.
Figure 5:
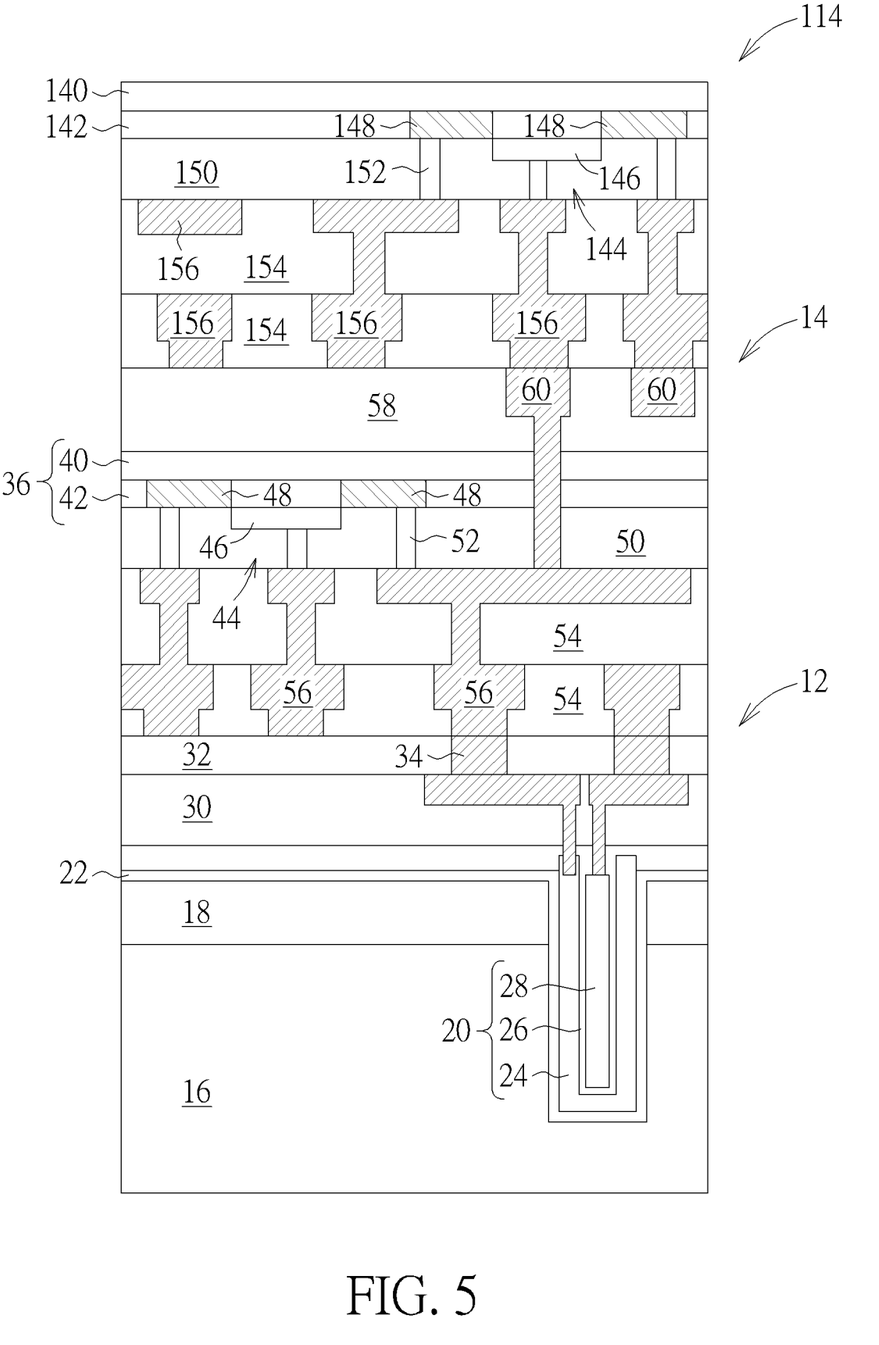
Figure 6:
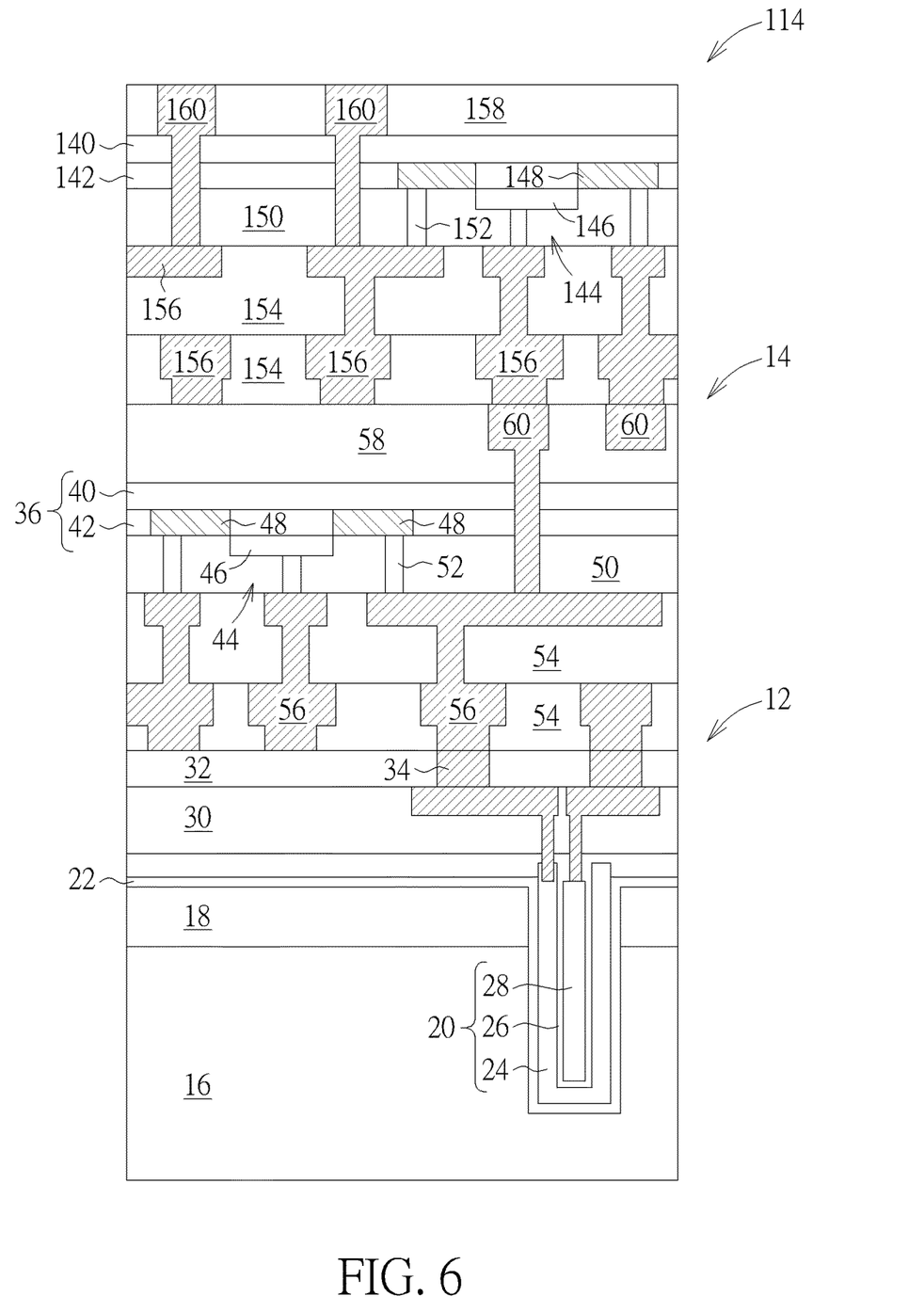

Referring to FIGS. 4-6, FIGS. 4-6 illustrate a method for fabricating a semiconductor package structure according to an embodiment of the present invention. As shown in FIG. 4, a semiconductor package structure fabricated from bonding a wafer 12 and a wafer 14 through processes disclosed in FIGS. 1-3 is first provided and then another wafer 114 is provided thereafter. Preferably, the wafer 114 is used for fabricating switch devices or low noise amplifiers (LNA) in the later process.

In this embodiment, the wafer 114 and the wafer 14 shown in FIG. 1 preferably share same structures and components. For instance, the wafer 114 also includes a substrate 136 made from a SOI substrate, which includes a first semiconductor layer 138, an insulating layer 140 on the first semiconductor layer 138, and a second semiconductor layer 142 on the insulating layer 140. Similar to the aforementioned embodiment, the first semiconductor layer 138 and the second semiconductor layer 142 could be made of same material or different material and could both be made of material including but not limited to for example silicon, germanium, or silicon germanium (SiGe) and the insulating layer 140 disposed between the first semiconductor layer 38 and second semiconductor layer 42 preferably includes $SiO_2$, but not limited thereto.

At least an active device 144 could be disposed on the substrate 136, in which the active device 144 could include metal-oxide semiconductor (MOS) transistor, oxide semiconductor field effect transistor (OS FET), fin field effect transistor (FinFET), or other active devices. If a MOS transistor were to be fabricated, the MOS transistor could include elements such as a gate structure 146 on the substrate 136, a spacer (not shown) adjacent to the sidewalls of the gate structure 146, and a source/drain region 148 in the substrate 136 adjacent to two sides of the spacer.

An ILD layer 150 is disposed on the wafer 114 to cover the MOS transistor or other active devices, contact plugs 152 are formed in the ILD layer 150 to electrically connect the source/drain region 148 and the gate structure 146, an IMD layer 154 is disposed on the ILD layer 150, and metal interconnections 156 are disposed in the IMB layer 154 to connect to the contact plugs 152.

Next, a bonding process shown in FIG. 2 could be conducted by using a direct bond interconnect (DBI) approach to bond the wafer 14 and the wafer 114. Preferably, the bonding process could be accomplished by first reversing the wafer 114 so that the front side of the wafer 114 or the exposed surface of the metal interconnections 156 and IMD layer 154 is facing toward the front side of the wafer 14 or the exposed surface of the metal interconnection 60 and dielectric layer 58, and then performing a thermal treatment process to directly bond the two wafers 14, 114 by directly contacting the metal interconnections 156 and the IMB layer 154 of the wafer 114 with the metal interconnections 60 and dielectric layer 58 of the wafer 14.

Next, as shown in FIG. 5, the first semiconductor layer 138 from the substrate 136 of the wafer 14 is removed to expose the surface of the insulating layer 140.

Next, as shown in FIG. 6, one or more dielectric layer 158 could be formed on the insulating layer 140 and metal interconnections 160 are formed in the dielectric layer 158, the substrate 136, and the ILD layer 150 for connecting to the metal interconnections 156 that have been formed in the IMB layer 154 since FIG. 4. This completes the fabrication of a semiconductor package structure according to an embodiment of the present invention. It should be noted that even though only a third wafer 114 is stacked on top of the two wafers 12, 14 in this embodiment, according to other embodiment of the present invention, it would also be desirable to repeat the processes conducted in FIGS. 4-6 for forming a semiconductor package structure having more than three wafers stacked on top of each other, which is also within the scope of the present invention.

Figure 7:
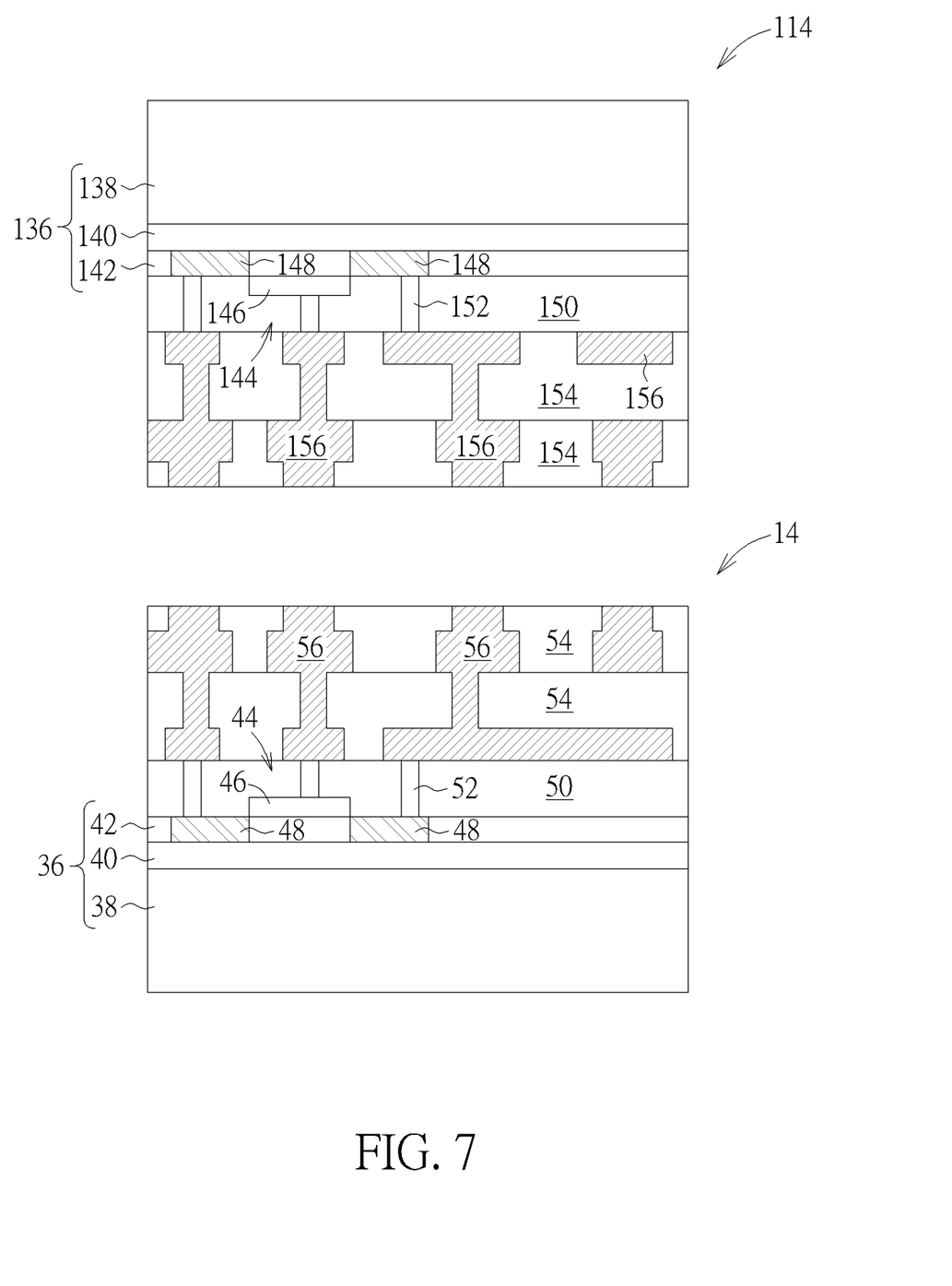
FIGS. 7-9 illustrate a method for fabricating a semiconductor package structure according to an embodiment of the present invention.
Figure 8:
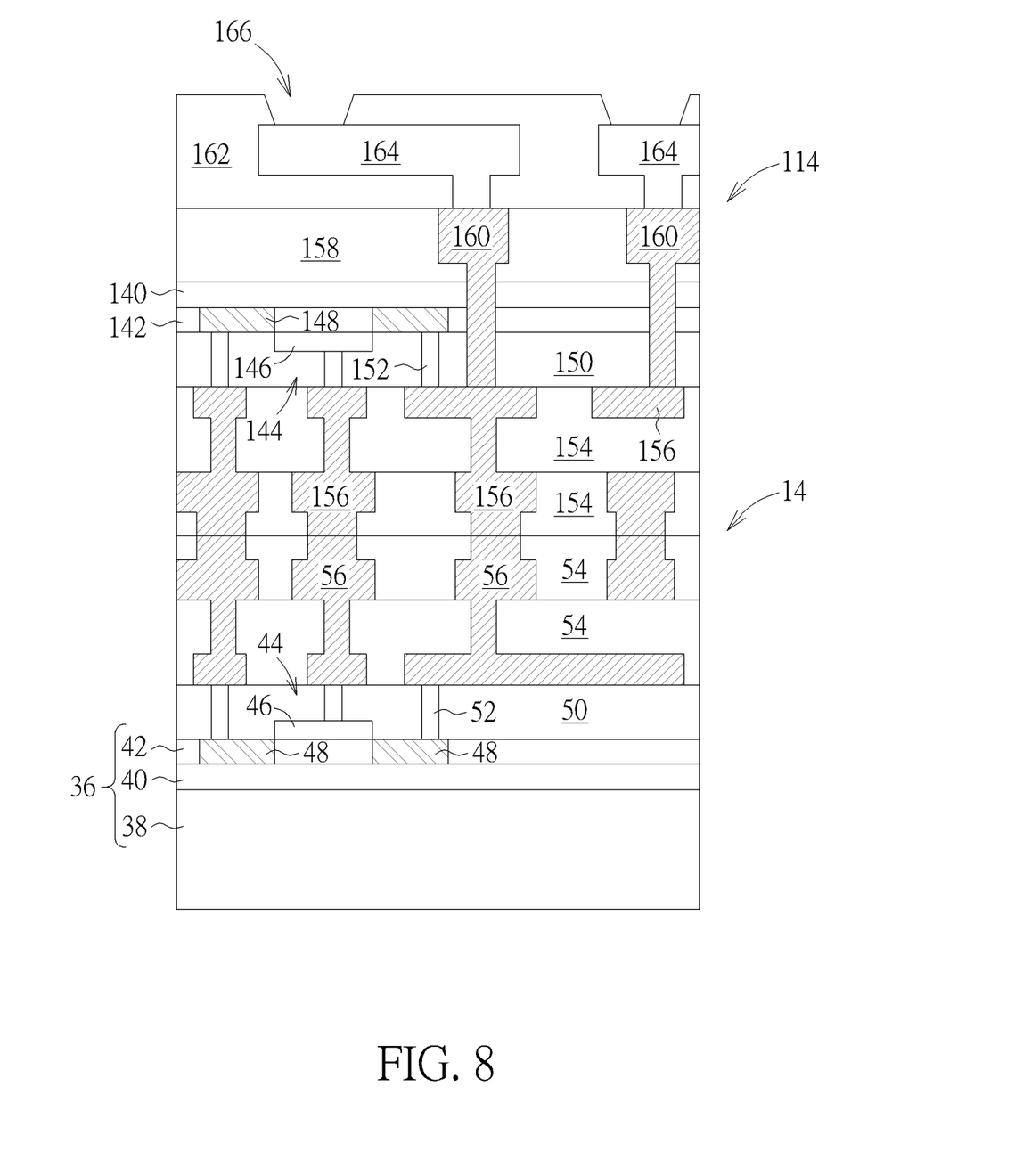
Figure 9:
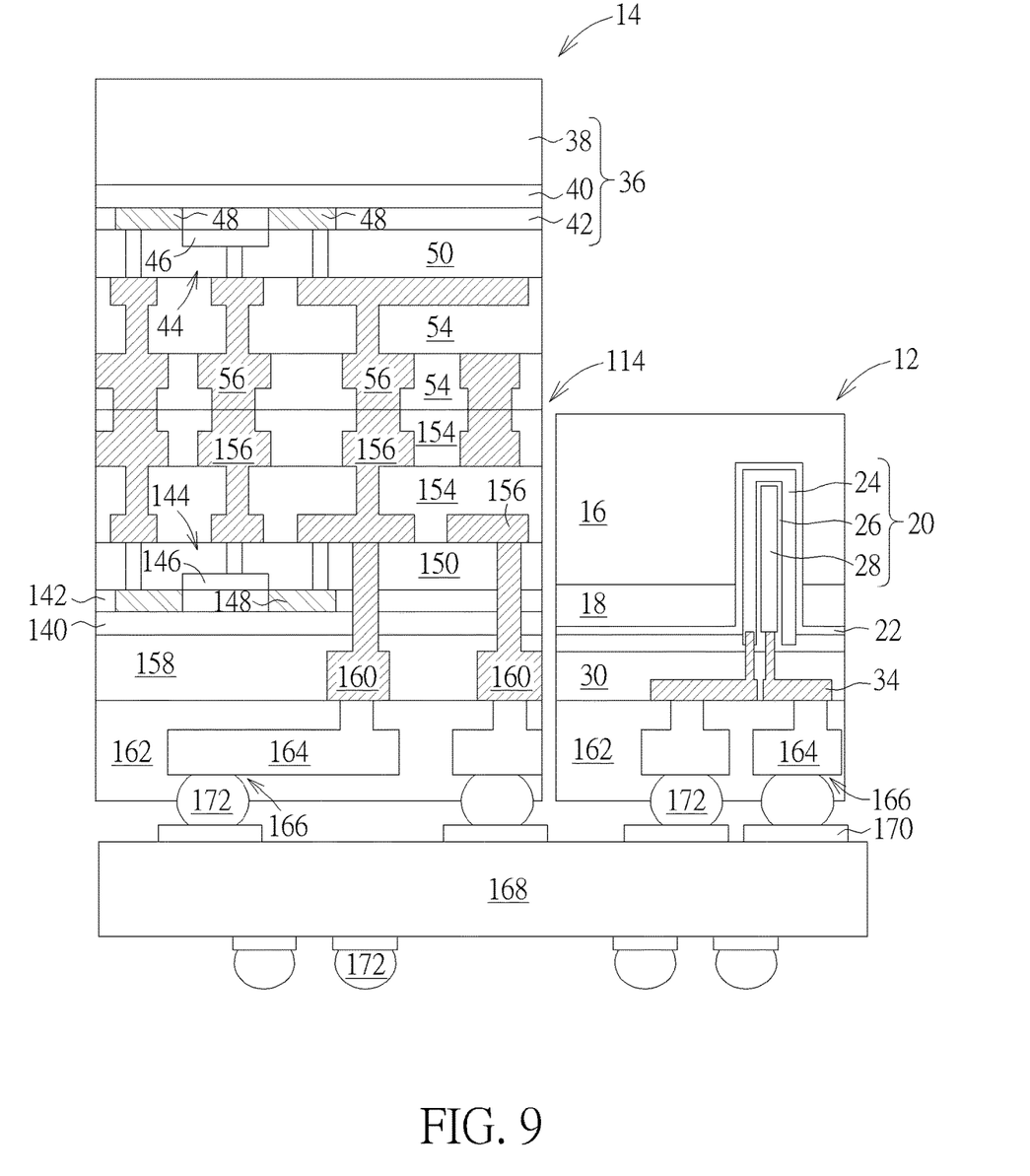

Referring to FIGS. 7-9, FIGS. 7-9 illustrate a method for fabricating a semiconductor package structure according to an embodiment of the present invention. As shown in FIG. 7, a wafer 14 and a wafer 114 could be provided, in which each of the wafers 14, 114 could share same structure as the wafer 14 shown in FIG. 1 and the wafer 114 shown in FIG. 4 and both the two wafers 14, 114 could also be used for fabricating switch devices or low noise amplifiers (LNA) in the later process. For simplicity purpose, the wafer 14 in this embodiment and the wafer 14 shown in FIG. 1 preferably share same numberings while the wafer 114 in this embodiment and the wafer 114 shown in FIG. 4 share same numberings.

Next, as shown in FIG. 7, after the wafers 14, 114 are provided, a bonding process similar to the one shown in FIG. 2 could be conducted by using a direct bond interconnect (DBI) approach to bond the wafer 14 and the wafer 114. Preferably, the bonding process could be accomplished by first reversing the wafer 114 so that the front side of the wafer 114 or the exposed surface of the metal interconnections 156 and IMB layer 154 is facing toward the front side of the wafer 14 or the exposed surface of the metal interconnections 56 and IMD layer 54, and then performing a thermal treatment process to directly bond the two wafers 14, 114 by directly contacting the metal interconnections 156 and the IMD layer 154 of the wafer 114 with the metal interconnections 56 and IMD layer 54 of the wafer 14.

Next, as shown in FIG. 8, the first semiconductor layer 138 from the substrate 136 of the wafer 14 is removed to expose the surface of the insulating layer 140, a dielectric layer 158 is formed on the insulating layer 140, and metal interconnections 160 are formed in the dielectric layer 158, the substrate 136, and the ILD layer 150 for connecting to the metal interconnections 156 that have been formed in the IMD layer 154 since FIG. 7. Next, another dielectric layer 162 is formed on the dielectric layer 158 and the metal interconnections 160, and then a contact plug fabrication process is conducted to form a redistribution layer (RDL) 164 and contact pad 166 in the dielectric layer 162. In this embodiment, the RDL 164 and the contact pad 166 are preferably made of metal such as aluminum (Al), but not limited thereto.

Next, as shown in FIG. 9, a packaging substrate 168 and another wafer 12 are provided and contact pads 170 are disposed on the packaging substrate 168. Preferably, the wafer 12 includes same element such as a deep trench capacitor 20 and metal interconnections 34 connecting the deep trench capacitor 20 as shown in FIG. 1 and elements including a dielectric layer 162, a RDL 164, and a contact pad 166 that have been shown on the wafer 114 in FIG. 8 are also formed on the metal interconnections 34 of the wafer 12. For simplicity purpose, elements on the wafer 12 in this embodiment and elements on the wafer 12 shown in FIG. 1 preferably share same numberings. Next, the two wafers 14, 114 bonded in FIG. 8 and the wafer 12 are reversed with front sides or exposed contact pads 166 of the two wafers 12, 114 facing toward the packaging substrate 168, and then bumps 172 or solder balls could be formed to bond and/or connect the contact pads 166 on the wafers 12, 114 and the contact pads 170 on the packaging substrate 168. This completes the fabrication of a semiconductor package structure according to an embodiment of the present invention.

Overall, the present invention discloses an approach of using direct bond interconnect (DBI) technique to bond a plurality of semiconductor wafers or chips for forming a semiconductor package structure made of 3DICs. Preferably, the fabricated structure could be applied to integration of RF-front end modules or switches, LNAs, and integrated passive devices (IPD). By using the aforementioned approach for stacking various semiconductor wafers or chips, it would be desirable to lower harmonics between chips, improve power loss, and simplifies overall design for the RF-front end modules.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first wafer comprising:
      a deep trench capacitor in a substrate;
      a first inter-layer dielectric (ILD) layer on the deep trench capacitor;
      a first inter-metal dielectric (IMD) layer on the first ILD layer;
      a second metal interconnection in the first ILD layer and the first IMD layer;
   a second wafer bonded to the first wafer, wherein the second wafer comprises:
      a first active device on a first silicon-on-insulator (SOI) substrate;
      a second ILD layer on the first active device;
      a second IMD layer on the second ILD layer;
      a first metal interconnection in the second ILD layer and the second IMD layer and connected to the first active device and the deep trench capacitor; and
   a third metal interconnection connected to the first metal interconnection and penetrating through the first SOI substrate.

2. The semiconductor device of claim 1, wherein the first IMD layer contacts the second IMD layer.

3. The semiconductor device of claim 1, wherein the first metal interconnection contacts the second metal interconnection.

4. The semiconductor device of claim 1, further comprising:
   a dielectric layer on the first SOI substrate; and
   the third metal interconnection in the dielectric layer, the first SOI substrate, and the second ILD layer.

5. The semiconductor device of claim 4, wherein the first metal interconnection contacts the third metal interconnection.

6. The semiconductor device of claim 5, further comprising:
   a third wafer bonded to the second wafer, wherein the third wafer comprises:
      a second active device on a second SOI substrate;
      a third ILD layer on the second active device;
      a third IMD layer on the third ILD layer; and
      a fourth metal interconnection in the third IMD layer and connected to the third metal interconnection.

7. The semiconductor device of claim 6, wherein the third IMD layer contacts the dielectric layer.

8. A semiconductor device, comprising:
   a first wafer on top of a packaging substrate, wherein the first wafer comprises a deep trench capacitor;
   a second wafer on top of the packaging substrate and adjacent to the first wafer; and
   a third wafer on the second wafer, wherein the second wafer and the third wafer are connected by direct bond interconnects.

9. The semiconductor device of claim 8, wherein the first wafer comprise:
   the deep trench capacitor in a substrate;
   a first inter-layer dielectric (ILD) layer on the deep trench capacitor; and
   a first metal interconnection in the first ILD layer;
   a first redistribution layer (RDL) between the first ILD and the packaging substrate; and
   a first bump connecting the first RDL and the packaging substrate.

10. The semiconductor device of claim 9, wherein the second wafer comprises:
    a first active device on a first silicon-on-insulator (SOI) substrate;
    a second interlayer dielectric (ILD) layer on the first active device;
    a first inter-metal dielectric (IMD) layer on the second ILD layer;
    a second redistribution layer (RDL) between the first SOI substrate and the packaging substrate;
    a second metal interconnection in the second ILD layer, the first IMD layer, and the first SOI substrate and connecting the first active device and the second RDL; and
    a second bump connecting the second RDL and the packaging substrate.

11. The semiconductor device of claim 10, wherein the third wafer comprises:
    a second active device on a second SOI substrate;
    a third ILD layer on the second active device;
    a second IMD layer on the third ILD layer; and
    a third metal interconnection in the second IMD layer and connecting the second active device and the second metal interconnection.

12. The semiconductor device of claim 8, wherein the first wafer and the second wafer are on a same level.

* * * * *